United States Patent
Upun et al.

(10) Patent No.: US 11,391,787 B2
(45) Date of Patent: Jul. 19, 2022

(54) HGA CIRCUITRY TESTING SYSTEMS, METHODS, AND DEVICES

(71) Applicant: Seagate Technology LLC, Cupertino, CA (US)

(72) Inventors: Teerapun Upun, Nakhon Ratchasima (TH); Khoon Yung Wong, Seremban Negeri Sembilan (MY); Rawinun Praserttaweelap, Samutprakarn (TH); Lin Han Wong, Selangor (MY)

(73) Assignee: Seagate Technology LLC, Fremont, CA (US)

( * ) Notice: Subject to any disclaimer, the term of this patent is extended or adjusted under 35 U.S.C. 154(b) by 212 days.

(21) Appl. No.: 16/810,234

(22) Filed: Mar. 5, 2020

(65) Prior Publication Data

US 2021/0278475 A1  Sep. 9, 2021

(51) Int. Cl.
*G01R 31/52* (2020.01)
*G11B 5/48* (2006.01)

(52) U.S. Cl.
CPC ............ *G01R 31/52* (2020.01); *G11B 5/4826* (2013.01)

(58) Field of Classification Search
CPC ...... G01R 31/52; G01R 31/50; G11B 5/4833; G11B 5/4853; G11B 5/4826
See application file for complete search history.

(56) References Cited

U.S. PATENT DOCUMENTS

| | | | |
|---|---|---|---|
| 5,438,273 A * | 8/1995 | Gergel | G01R 31/72 324/656 |
| 6,473,257 B1 * | 10/2002 | Shimazawa | G01R 33/093 360/324.2 |
| 7,034,372 B1 * | 4/2006 | Kulangara | G01M 7/025 257/E27.006 |
| 7,288,935 B2 * | 10/2007 | Farren | G11B 5/455 324/210 |
| 7,529,635 B2 | 5/2009 | Anderson et al. | |
| 7,542,868 B2 | 6/2009 | Herdendorf et al. | |
| 7,546,216 B2 | 6/2009 | Herdendorf et al. | |
| 7,684,948 B2 | 3/2010 | Holwell et al. | |
| 7,863,889 B1 * | 1/2011 | Bamrungtham | G11B 5/455 324/750.3 |
| 8,325,446 B1 * | 12/2012 | Liu | G11B 5/4833 360/245.9 |
| 8,536,875 B2 | 9/2013 | Ogle et al. | |
| 9,153,275 B1 * | 10/2015 | Naniwa | G11B 5/4833 |
| 9,285,392 B1 * | 3/2016 | Wobbe | G11B 5/455 |

(Continued)

FOREIGN PATENT DOCUMENTS

CN         1646925 A  *  7/2005  ............. B25J 9/023
KR   20080074717 A  *  8/2008

*Primary Examiner* — Patrick Assouad
*Assistant Examiner* — Demetrius R Pretlow
(74) *Attorney, Agent, or Firm* — Faegre Drinker Biddle & Reath LLP

(57) ABSTRACT

A system includes a voltage source, a current source, and a testing station. The testing system is arranged to mechanically and electrically connect to multiple head gimbal assemblies (HGAs) simultaneously, and the testing station includes conductors for electrically coupling to conductive pads of the HGAs. The system further includes memory containing instructions for causing a computing device to connect either the voltage source or the current source to the conductors corresponding to each of the HGAs to be connected to the testing station.

20 Claims, 7 Drawing Sheets

(56) References Cited

U.S. PATENT DOCUMENTS

| | | | | |
|---|---|---|---|---|
| 2001/0037183 A1* | 11/2001 | Aslami | ............... | C12N 15/8223 |
| | | | | 702/115 |
| 2005/0209797 A1* | 9/2005 | Anderson | ............ | G11B 5/4826 |
| | | | | 702/57 |
| 2006/0092548 A1* | 5/2006 | Mihara | ................ | G11B 5/4555 |
| | | | | 360/78.12 |
| 2006/0098367 A1* | 5/2006 | Marley | ................. | G01R 31/54 |
| | | | | 361/93.1 |
| 2006/0152856 A1* | 7/2006 | Zhao | .................... | G11B 5/4853 |
| | | | | 360/264.2 |
| 2006/0232271 A1* | 10/2006 | Farren | .................... | G11B 5/455 |
| | | | | 324/210 |
| 2008/0061776 A1* | 3/2008 | Collins | ................ | G11B 5/4555 |
| | | | | 324/252 |
| 2008/0192374 A1* | 8/2008 | Matsubara | ............. | G11B 27/36 |
| | | | | 360/31 |
| 2009/0027808 A1* | 1/2009 | Yao | ...................... | G11B 5/5552 |
| | | | | 360/294.4 |
| 2009/0077792 A1* | 3/2009 | Uematsu | ............. | G11B 5/4826 |
| | | | | 29/737 |
| 2009/0207529 A1* | 8/2009 | Yao | ...................... | H05K 1/0268 |
| | | | | 360/245.9 |
| 2009/0251825 A1* | 10/2009 | Honzawa | ............. | G11B 5/4853 |
| | | | | 360/245.3 |
| 2010/0079900 A1* | 4/2010 | Nakamura | ............. | G11B 5/455 |
| | | | | 360/75 |
| 2012/0200287 A1* | 8/2012 | Warn | .................... | G11B 5/4826 |
| | | | | 324/212 |
| 2012/0262812 A1* | 10/2012 | McGuire | ............. | G11B 5/4555 |
| | | | | 360/75 |
| 2013/0168370 A1 | 7/2013 | Kavosh | | |
| 2016/0307588 A1* | 10/2016 | Guzik | .................... | G01R 33/12 |

* cited by examiner

HGA CIRCUITRY TESTING SYSTEMS, METHODS, AND DEVICES

SUMMARY

In certain embodiments, a system includes a voltage source, a current source, and a testing station. The testing system is arranged to mechanically and electrically connect to multiple head gimbal assemblies (HGAs) simultaneously, and the testing station includes conductors for electrically coupling to conductive pads of the HGAs. The system further includes memory containing instructions for causing a computing device to connect either the voltage source or the current source to the conductors corresponding to each of the HGAs to be connected to the testing station.

In certain embodiments, a system includes a testing station that is arranged to mechanically and electrically connect to multiple HGAs simultaneously. The testing station includes conductors for electrically coupling to conductive pads of the HGAs. The system also includes a short detection assembly with a first switch for selectively coupling to the conductors and with a second switch for selectively coupling to the conductors. The second switch is controlled to sequentially electrically couple to the conductors while the first switch maintains electrically coupled to one of the other conductors.

In certain embodiments, a method is disclosed for using a testing system to detect an electrical short between conductive paths of an electronic device. The method includes electrically coupling, via a first switch, a first conductive path of the conductive paths to the testing system. The method further includes sequentially electrically coupling, via a second switch, other conductive paths to the testing system while maintaining the electrical coupling between the first conductive path and the testing system. The method also includes detecting a resistance between the first conductive path and the other conductive paths.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
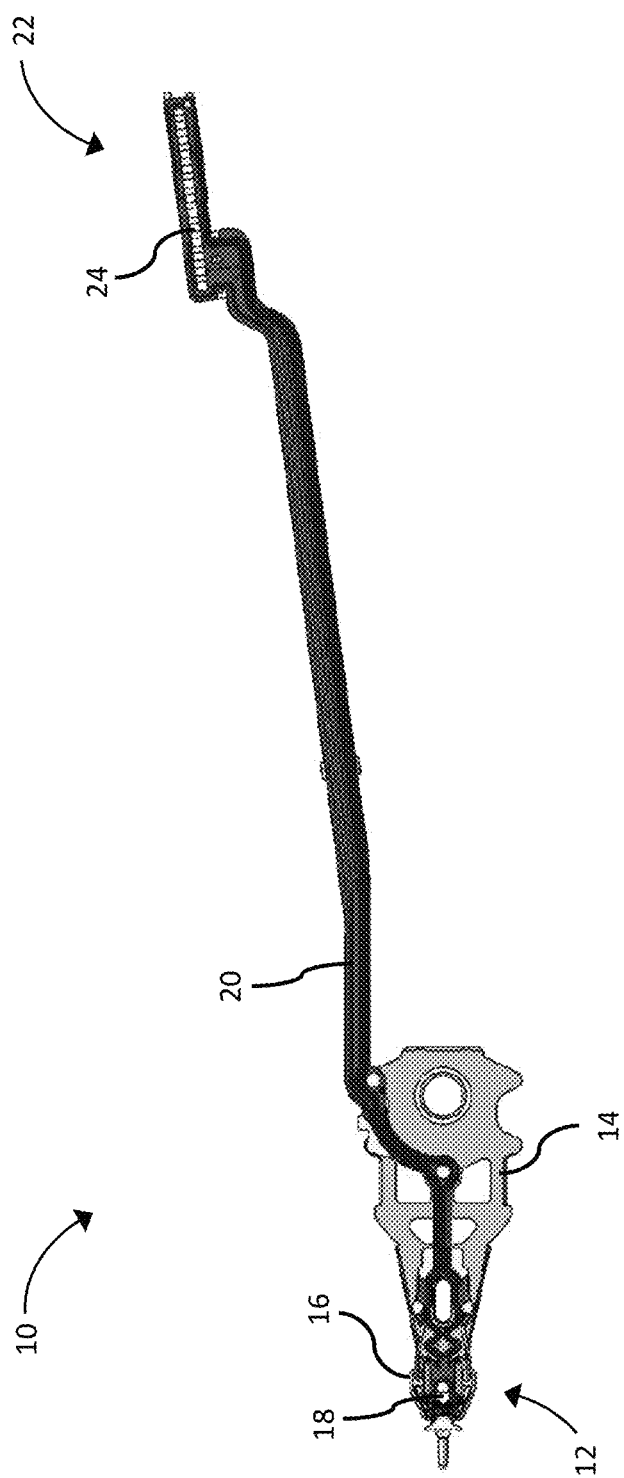
FIG. 1 shows a top view of a head-gimbal assembly, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

Data storage devices are created by assembling many components together in a final package. Before final testing and assembly, many of the components and sub-assemblies of data storage devices must pass through their own testing and assembly processes. As one example, hard disk drives include head-gimbal assemblies (HGAs) that—as will be described in more detail below—may contain electrical components such as laser diodes, resistive heaters, piezoelectric microactuators, magnetoresistive readers, magnetic writers, and associated wiring. Before HGAs are assembled into hard disk drives, the HGAs can be tested to help ensure that the HGAs are functioning as desired. However, the testing itself can cause damage to components of the HGAs and/or consume significant time.

Certain embodiments of the present disclosure are accordingly directed to testing systems and methods for HGAs. Although HGAs are used as an exemplary component with respect to the testing systems and methods, the testing systems and methods can be used for other types of components.

FIG. 1 shows an HGA 10, which includes a slider 12, a base plate 14, a suspension 16 coupled to the base plate 14, and various electrical components (e.g., components activated by electrical signals or configured to communicate electrical signals). In certain embodiments, the HGA 10 includes a laser diode 18 and one or more resistive heaters, piezoelectric microactuators, magnetoresistive readers, and magnetic writers. The HGA 10 also includes a flexible circuit 20 and a tail section 22, which includes conductive pads 24. The flexible circuit 20 includes conductors (e.g., conductive wiring) that communicate electricals signals between the various electrical components (e.g., the laser diode 18, the resistive heaters) and the conductive pads 24. When the HGA 10 is installed in a hard disk drive, the conductive pads 24 facilitate communication of electrical signals to and from the HGA 10 and circuitry (e.g., system-on-a-chip integrated circuits, power supplies, preamplifiers) of the hard disk drive.

Prior to installing the HGA 10 into a hard disk drive, the HGA 10 can be subjected to tests to characterize and help ensure functionality of the electrical components of the HGA 10.

Figure 2:
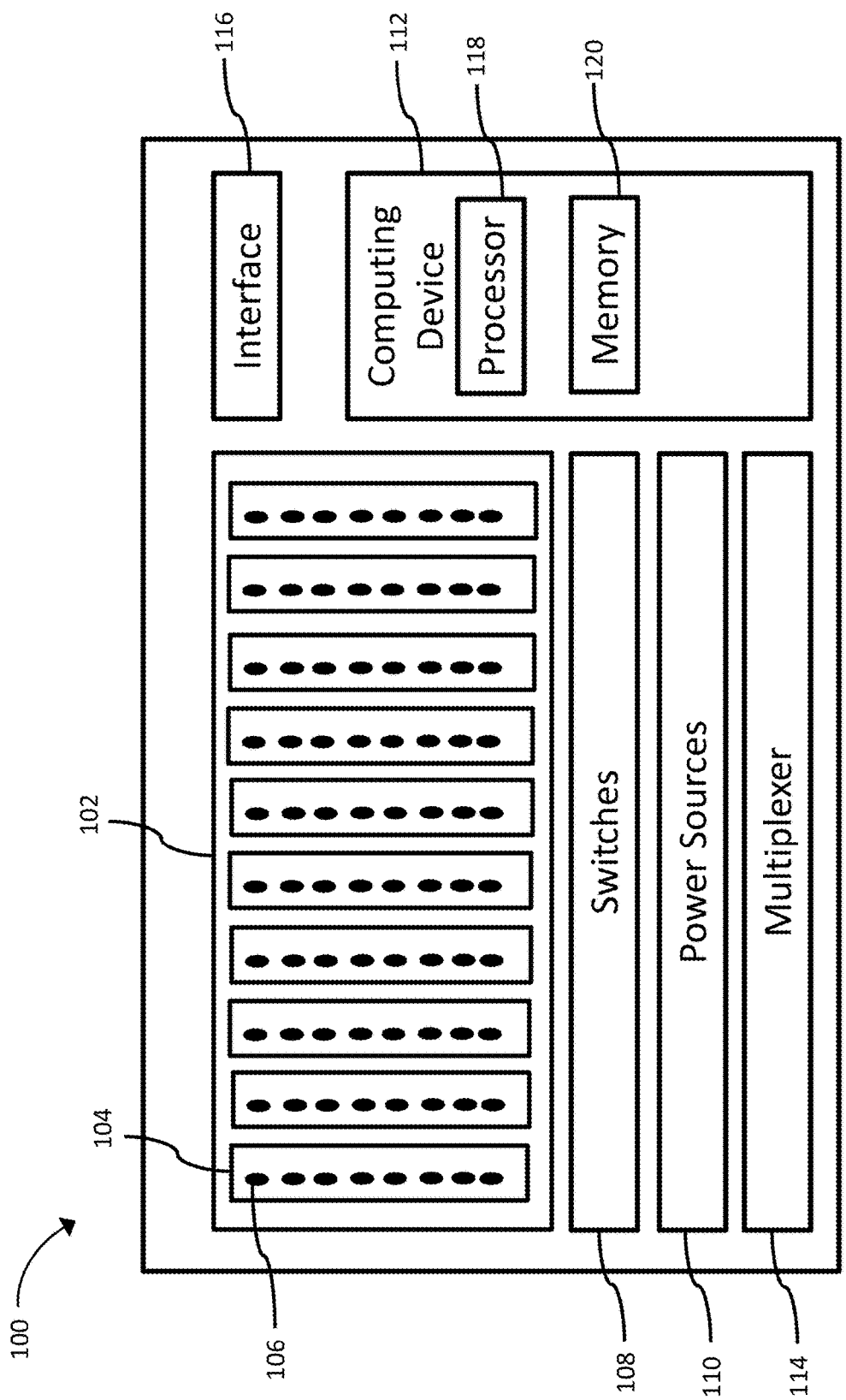
FIG. 2 shows a schematic of a testing system, in accordance with certain embodiments of the present disclosure.

FIG. 2 shows a schematic of a testing system 100. The testing system 100 includes a testing station 102 to which multiple HGAs 10 can be mechanically and electrically connected. For example, the testing station 102 can include multiple individual HGA stations 104 that are shaped and sized to receive the tail sections 22 of the HGAs 10. The HGA stations 104 can include conductors 106 (e.g., a row of conductors), which are described in more detail with respect to FIG. 3. Although the testing system 100 is shown as including ten HGA stations 104, fewer or more HGA stations 104 can be used. The particular number of HGA stations 104 can depend on, among other things, balancing between constraints such as space and hardware capabilities to simultaneously test certain numbers of HGAs 10 and the desire to increase the throughput of the testing system 100.

The testing system 100 includes—and the testing station 102 is communicatively coupled to—switches 108, power sources 110, a computing device 112, a multiplexer 114, and an interface 116. As will be described in more detail below, the switches 108 can selectively couple the power sources 110 to different conductors 106 in response to instructions stored and followed by the computing device 112. The power sources 110 can include a voltage source and a current source, which are described in more detail below.

The computing device 112 can be a computer with a central processing unit (CPU) that includes a processor 118 and programmable memory 120 (e.g., a non-transient computer readable medium). The memory 120 can store instructions that, when followed and implemented by the processor 118, cause the computing device 112 to carry out various routines or methods described herein, among other things, of the testing system 100.

The multiplexer 114 is communicatively coupled to the testing station 102 to send and receive electrical signals to and from multiple conductors 106 simultaneously. For example, at a given time, the multiplexer 114 can be configured to simultaneously send and/or receive electrical signals from a pair of conductors 106 from each of the HGA stations 104. As will be described in more detail below, individual pairs of conductors 106 may be referred to as channels in the HGA 10. In certain embodiments, the multiplexer 114 is located/connected between the switch(es) 108 and testing station 102. The multiplexer 114 can take the form of one or more integrated circuits, and the configuration of the multiplexer 114 can be controlled by the computing device 112.

In certain embodiments, the interface 116 is an electrical connector or a wireless transmitter (e.g., a wireless antenna communicatively coupled to a wireless network) that are arranged and configured to communicate to systems (e.g., data storage system, central database, network) external to the testing system 100. In certain embodiments, the testing system 100 includes both an electrical connector and a wireless transmitter.

Figure 3:
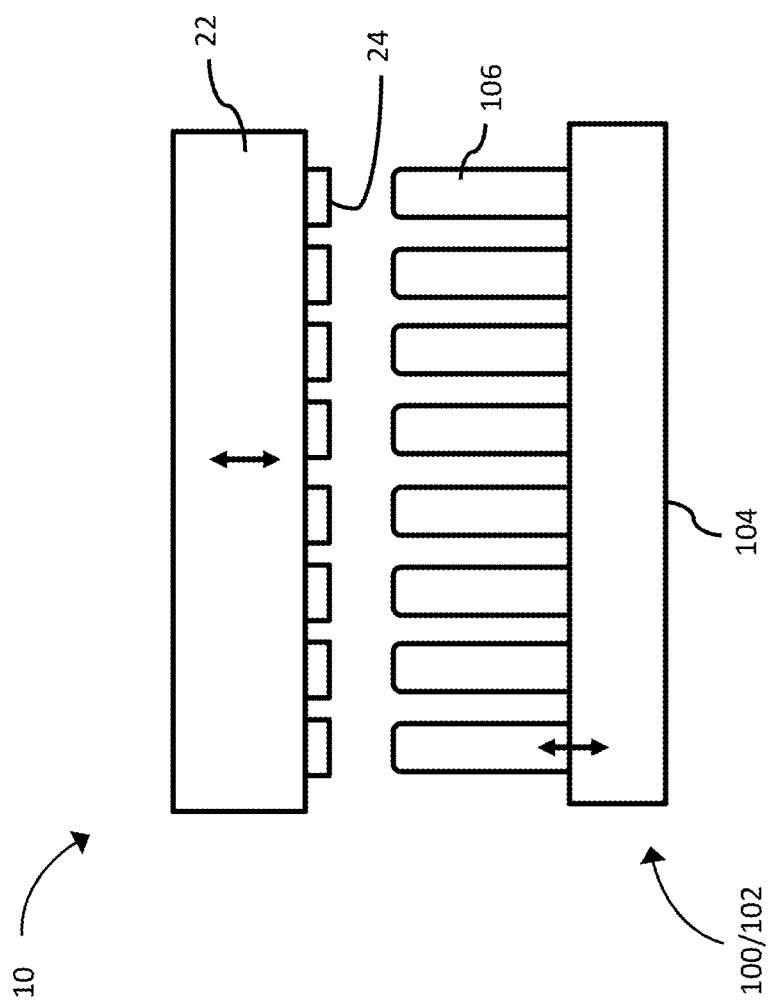
FIG. 3 shows a schematic side view of a portion of the testing system of FIG. 2, in accordance with certain embodiments of the present disclosure.

FIG. 3 shows a schematic side view of a portion of one of the HGAs 10 (e.g., the tail section 22 of the HGA 10) and a portion of one of the HGA stations 104 of the testing station 102. As noted above, the HGA stations 104 can include the conductors 106. Before testing routines of the testing system 100 are initiated, the HGA 10 can be mechanically and electrically coupled to the testing system 100. For example, the conductive pads 24 of the tail section 22 of the HGA 10 can be mechanically and electrically coupled to the conductors 106 of the testing system 100. A pick-and-place apparatus (e.g., an end effector and/or a robotic arm) can grab the HGA 10 and move the HGA 10 towards the conductors 106. The conductors 106 can be pin-shaped and can be configured to move into and out of the HGA station 104 so that the respective conductors 106 can contact each of the conductive pads 24 of the HGA 10. In certain embodiments, the conductors 106 are pogo pins, which are spring-loaded electrical connectors. In certain embodiments, the HGA station 104 includes a conductor 106 for each conductive pad 24 of the HGA 10.

As noted above, the conductors 106 can be communicatively coupled to the switches 108, which can selectively couple the conductors 106 to the power sources 110. As such, when the HGA 10 is mechanically and electrically coupled to the conductors 106, the HGA 10 and its electrical components (via the conductive pads 24) can be communicatively coupled to the switches 108 and selectively to the power sources 110 as described further below.

Figure 4:
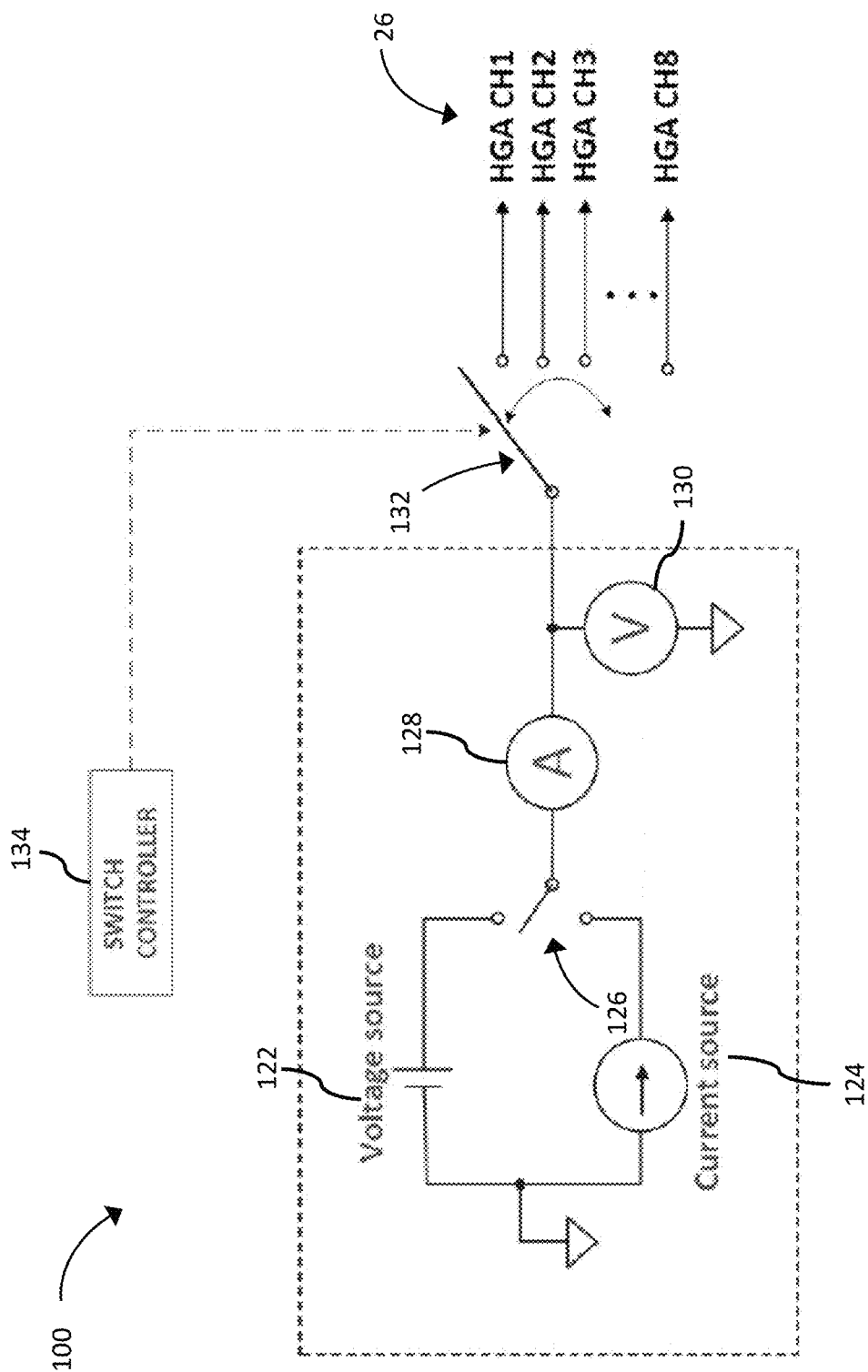
FIG. 4 shows a schematic of electrical components of the testing system of FIG. 2, in accordance with certain embodiments of the present disclosure.

FIG. 4 shows a schematic of various electrical components of the testing system 100. The testing system 100 includes a voltage source 122 and a current source 124, which can be selectively coupled to the HGAs 10 via a power source switch 126. The testing system 100 further includes a current meter 128 and a voltage meter 130. The testing system 100 also includes an HGA selection switch 132 and a switch controller 134. The switch controller 134 may be a component of—or otherwise controlled by—the computing device 112. In certain embodiments, the HGA selection switch 132 and/or the switch controller 134 can take the form of one or more integrated circuits.

In operation, the HGAs 10 are positioned on the testing station 102 and mechanically and electrically coupled to the conductors 106. Once positioned, the computing device 112 can initiate a routine (e.g., a set of instructions stored on the memory 120). One routine involves applying a voltage signal or a current signal to channels 26 (represented as HGA CH1, HGA CH2, etc., in FIG. 4) of the HGAs 10 to test the channels 26 of the HGAs 10. Each channel 26 of the HGAs 10 can include a pair of conductive pads 24 of the HGAs 10. For example, one pair of conductive pads 24 (e.g., one channel 26 of the HGA 10) may be coupled to the laser diode 18 (e.g., via conductors in the flexible circuit 20). One of the conductive pads 24 of that channel 26 can be coupled to an input of the laser diode 18 and the other conductive pad 24 of that channel 26 can be coupled to an output of the laser diode 18. Another pair of conductive pads 24 (e.g., another channel 26 of the HGA 10) can be coupled to the resistive heater in the slider 12, and so on with the remaining channels 26.

As part of the routine, the computing device 112 can cause the HGA selection switch 132 (e.g., via the switch controller 134) to sequentially couple to individual channels 26 of the HGA 10 so that the individual channels 26 are electrically coupled to either the voltage source 122 or the current source 124 (e.g., via the power source switch 126). Although FIG. 4 shows channels 26 for just one HGA 10, one channel 26 from each of the other HGAs 10 coupled to the testing system 100 can simultaneously be electrically coupled the voltage source 122 or the current source 124. However, in certain embodiments, only one channel 26 from each individual HGA 10 may be coupled to the voltage source 122 or the current source 124 at a given point in time.

The routine can include instructions that control the power source switch 126 to apply the voltage source 122 for certain channels 26 and the current source 124 for other channels 26. For example, the laser diode 18 may be more susceptible to being damaged by the voltage source 122 than the current source 124. As such, the routine can include using the power source switch 126 to couple to the current source 124 when the HGA selection switch 132 is coupled to the channel 26 of the laser diode 18. In certain embodiments, the current source 124 is only used for channels 26 associated with the laser diode 18. If the particular arrangement of the channels 26 on the tail sections 22 of the HGAs 10 is different for different models of hard disk drives, the routine can be programmed to account for such differences as the testing system 100 is used for different models.

Other routines can include applying a varying voltage signal or current signal to the channels 26 of the HGAs 10 coupled to the testing system 100 to characterize and/or confirm that electrical components of the HGA 10 are operating within desired ranges. As one example, a varying voltage signal and/or current signal can be sequentially applied to one or more of the channels 26 and the responsive voltage and/or current (both positive and negative values) can be measured for I-V characterization of the channels 26 and their electrical components. The I-V characterization can indicate whether the respective resistance values of the electrical components of the HGA 10 are within a desired range of resistance values. As another example, a varying current can be applied to the channel 26 of the laser diode 18 to check or confirm the quality of the solder electrically coupling the laser diode 18 to the slider 12.

In certain embodiments, the testing system 100 limits how much voltage and/or current is applied to a given channel 26 to avoid electrostatic discharge or to otherwise avoid supplying too much power to the channels 26. The particular limits can be customized and programmable for a given channel 26. For example, the channel 26 associated with the laser diode 18 may have a limit that is different than a limit for another channel 26.

The amount of voltage being provided by the voltage source 122 can be measured by the voltage meter 130, and the amount of current being provided by the current source 124 can be measured by the current meter 128. The voltage meter 130 can output a signal indicative of the measured voltage, and the current meter 128 can output a signal indicative of the measured current. The outputted signals can be transmitted to the computing device 112, which can compare the outputted signals to respective voltage limits and current limits. In the event the measured voltage and/or current reaches the respective limits, the computing device 112 can disable, power off, or otherwise limit the voltage source 122 and/or the current source 124 to reduce the risk of damaging electrical components of the HGA 10.

Figure 5:
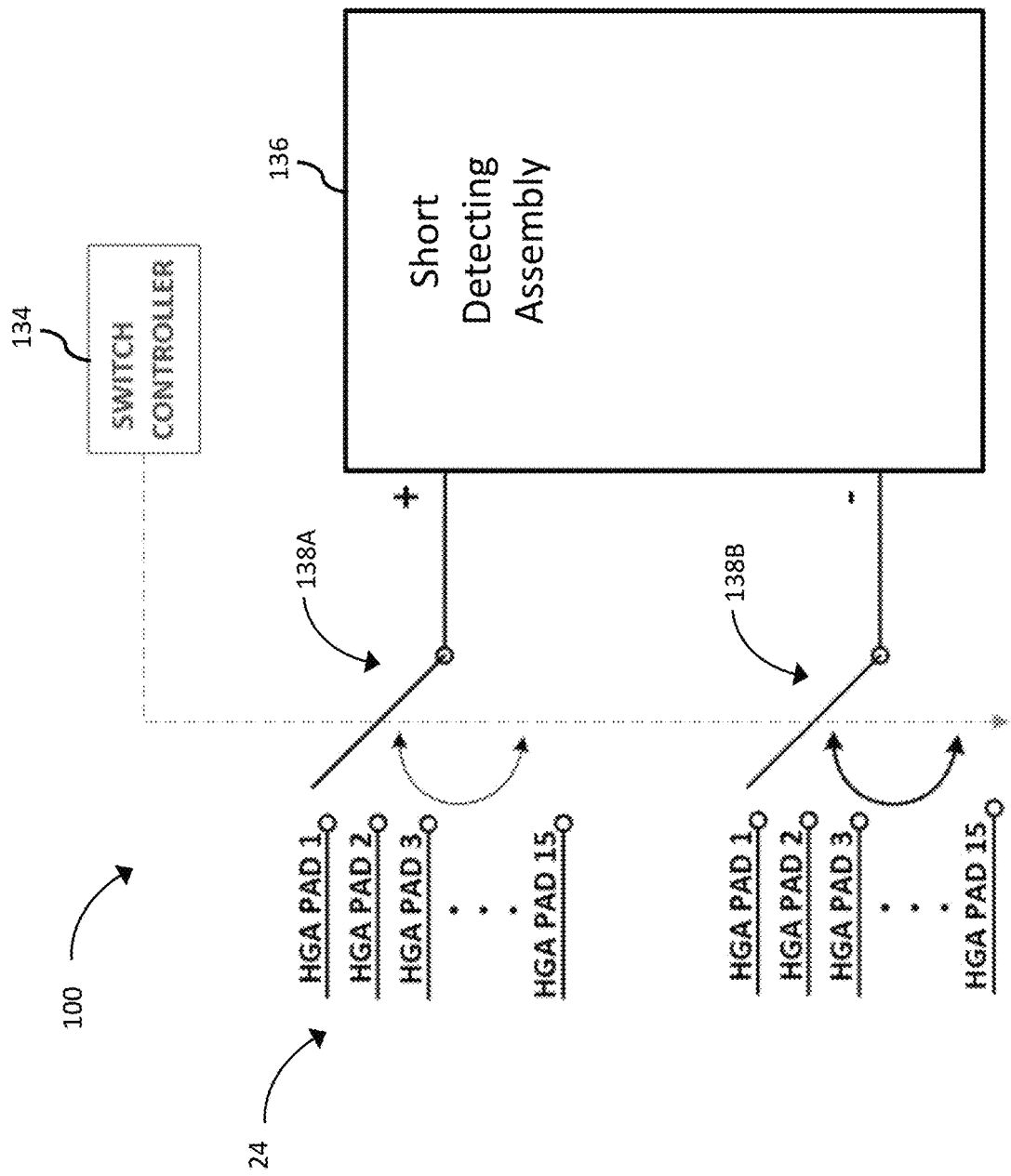
FIG. 5 shows a schematic of electrical components of the testing system of FIG. 2 for detecting an electrical short, in accordance with certain embodiments of the present disclosure.

FIG. 5 shows a schematic of electrical components of the testing system 100 for detecting an electrical short. The testing system 100 can include a short detection assembly 136 that is configured to detect whether an electrical short exists between or among the conductive pads 24 and their associated electrical components and wiring along the flexible circuit 20. For example, a short may exist when one of the conductive pads 24 is electrically coupled to another unintended conductive pad 24. Such a short may occur when the wiring or electrical components coupled to the conductive pads 24 are not sufficiently insulated from each other.

The short detection assembly 136 includes multiple switches (e.g., a first switch 138A and a second switch 1386 shown in FIG. 5) that are controlled by the switch controller 134. In certain embodiments, testing system 100 can include separate multiple switch controllers such that the switch controller 134 shown in FIG. 4 is a different switch controller than that shown in FIG. 5. The switch controller 134 can follow one or more routines in which the switch controller 134 causes the first switch 138A and/or the second switch 138B to sequentially couple to one of the respective conductive pads 24 (represented as HGA PAD 1, HGA PAD 2, etc., in FIG. 5) of the HGA 10. For example, while the first switch 138A is coupled to one of the conductive pads 24 such as the HGA PAD 1, the switch controller 134 may sequentially couple the second switch 138B to the rest of the conductive pads 24 of the HGA 10. If the short detection assembly 136 determines that the HGA PAD 1 is electrically coupled to another conductive pad 24 (except for the conductive pad 24 for which HGA PAD 1 is paired with to create one of the channels 26), then the short detection assembly 136 can determine that the HGA 10 being tested includes a short. The short detection assembly 136 can detect whether, and to what extent, resistance exists across pairs of conductive pads 24. For example, once respective conductive pads 24 are coupled, via the switches 138A and 138B, the short detection assembly 136 can inject or apply a voltage (e.g., a small amount of voltage) to one of the conductive pads 24 and detect whether current flows to the other conductive pad 24. The applied voltage value and the measured current value can be used to calculate a resistance value. This resistance value can be feedback into the computing device 112, which can compare the calculated resistance value against a threshold and determine whether a short or open circuit exists across the respective conductive pads 24. As such, the short detection assembly 136 can determine the resistance across pairs of conductive pads 24 and detect electrical shorts.

The routine can further include continuing to use the switch controller 134 to control the switches 138A and 1386 to check different pairs of the conductive pads 24 until each of the possible pairs have been checked. Further, the testing system 100 can simultaneously carry out the above-described routine for each of the HGAs 10 coupled to the testing system 100.

The testing system 100 shown in the figures and described above provides flexible approaches for simultaneously testing multiple electrical components. In certain embodiments, the testing system 100 provides hardware and routines for selectively coupling electrical components to different power sources. Further, in certain embodiments, the testing system 100 provides hardware and routines for detecting electrical shorts in electrical components. While the disclosure illustrates testing HGAs 10 used in hard disk drives, in other embodiments the testing system 100 may be used to other types of electronic components.

Figure 6:
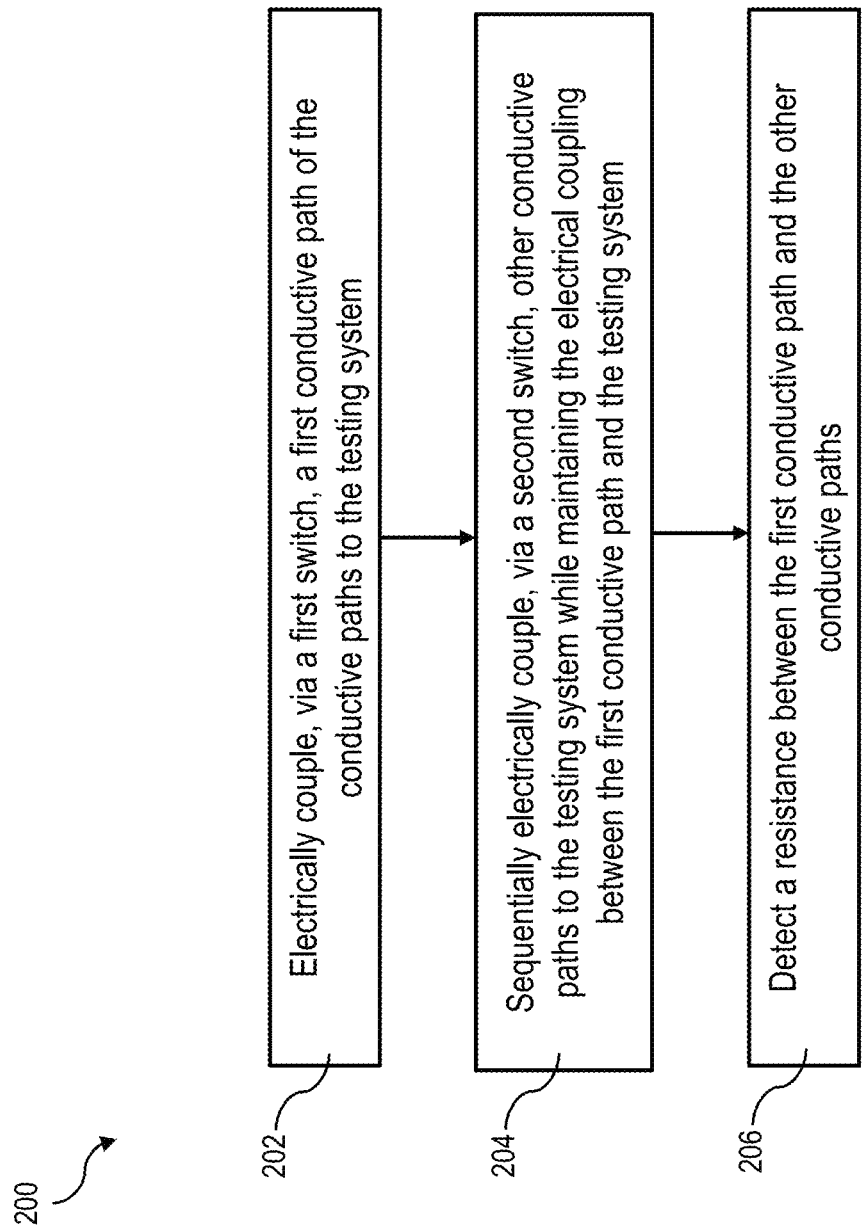
FIG. 6 shows a block diagram of a method, in accordance with certain embodiments of the present disclosure.

FIG. 6 outlines a method 200 for using the testing system 100 to detect an electrical short between conductive paths of an electronic device. The method 200 includes electrically coupling, via a first switch, a first conductive path of the conductive paths to the testing system 100 (block 202 in FIG. 6). The method 200 further includes sequentially electrically coupling, via a second switch, other conductive paths to the testing system 100 while maintaining the electrical coupling between the first conductive path and the testing system 100 (block 204 in FIG. 6). The method 200 further includes detecting a resistance between the first conductive path and the other conductive paths (block 206 in FIG. 6).

Figure 7:
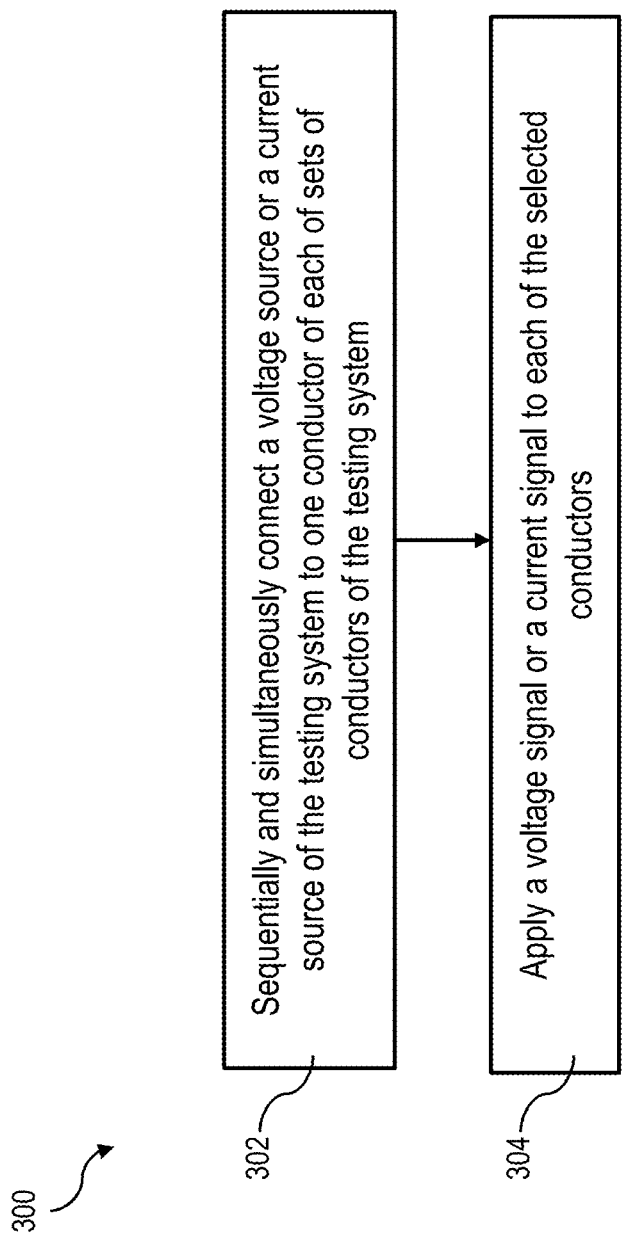
FIG. 7 shows a block diagram of another method, in accordance with certain embodiments of the present disclosure.

FIG. 7 outlines another method 300 for using the testing system 100 to simultaneously test multiple electronic devices. The testing system 100 includes a set of conductors for each electronic device. The method 300 includes sequentially and simultaneously connecting a voltage source or a current source of the testing system 100 to one conductor of each of sets of conductors of the testing system 100 (block 302 in FIG. 7). The conductors correspond to conductive pads on an electrical device. The method 300 further includes applying a voltage signal or a current signal to each of the selected conductors (block 304 in FIG. 7).

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A system comprising:
   a voltage source;
   a current source;
   a testing station arranged to mechanically and electrically connect to multiple head gimbal assemblies (HGAs) simultaneously, wherein the testing station includes conductors for electrically coupling to conductive pads of the HGAs;
   a computing device; and
   memory containing instructions for causing the computing device to:
   connect either the voltage source or the current source to pairs of the conductors corresponding to each of the HGAs to be connected to the testing station.

2. The system of claim 1, wherein the instructions cause the computing device to connect either the voltage source or the current source to the conductors for each of the HGAs simultaneously.

3. The system of claim 1, wherein the instructions cause the computing device to limit an amount of current applied to a given conductor.

4. The system of claim 3, wherein the given conductor is programmed to be electrically coupled to a laser diode.

5. The system of claim 3, wherein the testing station includes a current meter for measuring the amount of current applied to the given conductor.

6. The system of claim 5, wherein the instructions cause the computing device to disable the current source once the measured current reaches a threshold.

7. The system of claim 1, wherein the testing station is arranged to mechanically and electrically connect to up to ten HGAs simultaneously.

8. The system of claim 1, wherein the testing station includes one or more HGA stations arranged to handle only one HGA at a time, wherein each HGA station includes multiple conductors.

9. The system of claim 8, wherein the instructions cause the computing device to sequentially connect the voltage source or the current source to the conductors for each of the HGA stations.

10. The system of claim 1, further comprising:
    a switch for connecting either the voltage source or the current source to the conductors.

11. The system of claim 1, further comprising:
    a short detection assembly arranged to sequentially electrically couple to pairs of the conductors corresponding to each of the HGAs to be connected to the testing station.

12. The system of claim 11, wherein the short detection assembly includes multiple switches for electrically coupling to the pairs of the conductors.

13. A system comprising:
    a testing station arranged to mechanically and electrically connect to multiple head gimbal assemblies (HGAs) simultaneously, wherein the testing station includes conductors for electrically coupling to conductive pads of the HGAs; and
    a short detection assembly including a first switch for selectively coupling to the conductors and including a second switch for selectively coupling to the conductors, wherein the second switch is controlled to sequentially electrically couple to the conductors while the first switch remains electrically coupled to one of the other conductors.

14. The system of claim 13, wherein the short detection assembly is configured to detect electrical resistance between the one of the other conductors electrically coupled to the first switch and the conductors electrically coupled to the second switch as the second switch sequentially couples to the conductors.

15. The system of claim 13, further comprising:
    a switch controller configured to control the first switch and the second switch to selectively couple to the conductors.

16. The system of claim 13, wherein the switch controller is controlled by a computing device with memory that stores instructions that, when executed, cause the computing device to follow a routine for controlling the switch controller to selectively couple the first switch and the second switch to the conductors.

17. The system of claim 10, further comprising a multiplexor electrically positioned between the switch and the testing station.

18. The system of claim 17, wherein the multiplexor is an integrated circuit.

19. The system of claim 1, wherein each of the pairs of the conductors forms a channel.

20. The system of claim 19, wherein each HGA includes multiple channels, wherein only one channel from each HGA is coupled to the voltage source or to the current source at a given point in time.

* * * * *